US009696352B2

(12) United States Patent
Brown et al.

(10) Patent No.: US 9,696,352 B2
(45) Date of Patent: Jul. 4, 2017

(54) CURRENT SENSE CIRCUIT WITH OFFSET CALIBRATION

(71) Applicant: Hella Corporate Center USA, Inc., Plymouth, MI (US)

(72) Inventors: Alan Wayne Brown, Canton, MI (US); Mark Allen Enderich, Riverview, MI (US); Stanley Smith, Troy, MI (US)

(73) Assignee: Hella Corporate Center USA, Inc., Plymouth, MI (US)

( * ) Notice: Subject to any disclaimer, the term of this patent is extended or adjusted under 35 U.S.C. 154(b) by 0 days.

(21) Appl. No.: 14/331,666

(22) Filed: Jul. 15, 2014

(65) Prior Publication Data

US 2015/0022184 A1    Jan. 22, 2015

Related U.S. Application Data

(60) Provisional application No. 61/846,913, filed on Jul. 16, 2013.

(51) Int. Cl.
*G01R 1/02* (2006.01)
*G01R 19/25* (2006.01)
*G01R 1/20* (2006.01)

(52) U.S. Cl.
CPC ............. *G01R 19/25* (2013.01); *G01R 1/203* (2013.01)

(58) Field of Classification Search
CPC ........ G01R 19/00; G01R 19/25; G01R 1/203; H03F 3/45
USPC ........ 324/117 R, 126, 127, 130, 713, 123 R, 324/750.3; 327/77, 266, 246, 308, 451, 327/81, 89; 330/9, 69, 257, 264
See application file for complete search history.

(56) References Cited

U.S. PATENT DOCUMENTS 6,316,931 B1   11/2001 Nakagawa et al.
6,617,838 B1    9/2003 Miranda et al.
(Continued)

FOREIGN PATENT DOCUMENTS

JP    2009282050 A    12/2009
JP    2013031082 A     2/2013

OTHER PUBLICATIONS

Precision Analog Cookbook—Sensor Solutions—Current Sense, Simple and Accurate High Side Current Sense Circuit. Application note [online]. Intersil Americas LLC. Mar. 2013 [retrieved Oct. 11, 2014]. Retrieved from the Internet: <URL: http://lwww.intersil.com/content/damltntersil/cotlateral/en/cookbooks/st-091.pdf>. pp. 1-2.
(Continued)

*Primary Examiner* — Arleen M Vazquez
*Assistant Examiner* — Steven Yeninas
(74) *Attorney, Agent, or Firm* — Husch Blackwell LLP

(57) ABSTRACT

A switching device is controlled by a microprocessor to selectively configure the circuit between a current measurement mode and a calibration mode. When the switch is set to the "on" state, the circuit acts as a normal prior art circuit, with the output $V_{out}$ being read by the microprocessor to determine the current to the load. However, when the switch is set to the "off" state, a small value resistor (which may be roughly three orders of magnitude greater than $R_{shunt}$) connects the inputs of the measuring circuit so that the circuit can generate an output $V_{out}$ corresponding to the zero load current. By connecting the $V_+$ and $V_-$ inputs together with a low resistance resistor, the no-load condition $V_{diff}=V_+-V_-\approx 0$ applies. In this state, the no-load offset can be determined by measuring the output voltage of the circuit without turning off the load.

12 Claims, 6 Drawing Sheets

(56) References Cited

U.S. PATENT DOCUMENTS

| | | | | |
|---|---|---|---|---|
| 2005/0017760 A1* | 1/2005 | Grasso | ............... | G01R 19/0092 |
| | | | | 327/50 |
| 2005/0218976 A1* | 10/2005 | Haraguchi | .......... | H03F 3/45977 |
| | | | | 330/9 |
| 2006/0049854 A1 | 3/2006 | Grasso et al. | | |
| 2013/0009655 A1* | 1/2013 | Marten | .................. | G01R 1/203 |
| | | | | 324/713 |
| 2013/0147559 A1 | 6/2013 | Schaffer | | |

OTHER PUBLICATIONS

LTC6102 Precision Zero Drift Current Sense Amplifier. Data sheet 6102fe [online]. Linear Technology Corporation. 2007 [retrieved Oct. 11, 2014]. Retrieved from the Internet: <URL: http:/lcds.linear.com/docs/en/datasheetl6102fe.pdf>. pp. 1-26.

Automotive Power Advanced Sense Calibration and Benefits Guide. Application note [online]. Infineon Technologies AG. Apr. 27, 2011 [retrieved Oct. 11, 2014]. Retrieved from the Internet: <URL: http://www.infineon.com/dgdi/AppNote-Advanced-Sense-Calibration-and-Benefits-Guide-10-Infineon.pdf?folderId=db3a304317a748360117eee5521349bb&fileId=db3a30434039e4f70140524faf7f47fe& ack=t>. pp. 1-27.

Regan et al. Current Sense Circuit Collection—Making Sense of Current. Application note 105 [online]. linear Technology Corporation. Dec. 2005 [retrieved Oct. 11, 2014]. Retrieved from the Internet: <URL: http://cds.linear.com/docs/en/application-note/an105fa.pdf>. pp. 1-118.

International Search Report and Written Opinion for PCT/US14/46658 dated Nov. 5, 2014.

* cited by examiner

CURRENT SENSE CIRCUIT WITH OFFSET CALIBRATION

CROSS-REFERENCE TO RELATED APPLICATIONS

The present invention claims the benefit of U.S. Provisional Patent Application No. 61/846,913 for CURRENT SENSE WITH OFFSET CALIBRATION ALGORITHM, filed on Jul. 16, 2013.

FIELD OF THE INVENTION

The present invention relates to a circuit for determining the no-load output voltage of a circuit and, more particularly, to a circuit for sensing the current at a particular point in a system, and for intermittently updating the no-load offset in order to more accurately determine the current.

BACKGROUND OF THE INVENTION

In order to determine the current passing through a specific point in an electrical circuit, a shunt-based current measurement circuit is often used. Such a circuit uses a current shunt resistor and an amplifier. As is well known in the art, the voltage drop across a resistor is equal to the current passing through the resistor multiplied times the resistance of the resistor: V=IR. The current shunt resistor's resistance is typically very small and accurately known, and the voltage drop across the resistor can be accurately measured. This allows for a calculation of the current passing through the resistor. An example of a prior art circuit is shown in FIG. 1.

$U_1$ is an amplifier circuit which measures the small voltage across the current shunt resistor $R_{shunt}$ ($V_+$ and $V_-$), and applies a fixed, known gain. The output of $U_1$ is then passed to a microcontroller 10 for processing, such as by an analog to digital converter. By determining the voltage $V_{out}$ from $U_1$, the voltage across $R_{shunt}$ can be determined, which allows the load current across $R_{shunt}$ to be determined. Such systems are well known in the art.

However, the current and voltage measurements in a circuit are affected by the load connected to the circuit. The voltage across—and therefore the current through—the shunt resistor differs when the load is connected to the circuit as compared to when there is no load connected to the circuit. The "no-load output voltage" or "no-load offset" of the circuit refers to its output voltage when the load current is zero. Measurement errors occur when the offset is not known or changes during operation. FIG. 2 illustrates an example transfer function with the offset taken into account.

As illustrated in FIG. 2, the linear transfer function crosses the voltage access at a non-zero number, which is the no-load offset. The no-load offset should therefore be taken into account when determining the current flowing through the shunt resistor.

This offset may actually drift over time. The no-load offset may be affected by the temperature and/or aging of the components in the circuit. As such, in order to properly calibrate any current determination, the no-load offset should be recalculated from time to time. The easiest way to calculate the no-load offset is to disconnect the load from the rest of the circuit, i.e., to set the load current to zero. Unfortunately, this is difficult, impractical or impossible in many circuits.

It is therefore desirable to provide a system which will allow the no-load offset to be recalculated in without removing the load from a circuit. Preferably such a system would be adaptable to either a high- or a low-side circuit. A "high-side" circuit includes the shunt resistor in series with the positive voltage source and before the load. A "low-side" circuit includes the shunt resistor in series after the load on the negative side of the voltage. Example prior art high- and low-side circuits are shown in FIGS. 3 and 4, respectively.

SUMMARY OF THE INVENTION

The present invention relates to a system which measures the no-load offset voltage without setting load current to zero. A switching device is controlled by a microprocessor to selectively configure the circuit between a current measurement mode and a calibration mode. When the switch is set to the "on" state, the circuit acts as a normal prior art circuit, with the output $V_{out}$ being read by the microprocessor to determine the current to the load. However, when the switch is set to the "off" state, a small value resistor (which may be roughly three orders of magnitude larger than $R_{shunt}$) connects the inputs of the measuring circuit so that the circuit can generate an output $V_{out}$ corresponding to the zero load current. By connecting the $V_+$ and $V_-$ inputs together with a low resistance resistor, the no-load condition $V_{diff}=V_+-V_-\approx 0$ applies. In this state, the no-load offset can be determined by measuring the output voltage of the circuit without turning off the load.

The switch may be uni-directional in applications in which current always flows through the shunt resistor in one direction. However, where current may flow in either direction through the shunt resister, a bi-directional switch is preferred.

Additionally, the system may be applied to either high-side or low-side circuits. Although the overall arrangement of the circuit may differ, the offset calibration portion of the circuit will preferably include a shunt resistor with an input and an output, in which the input of the shunt resistor also leads to one input of an amplifier and the output of the shunt resistor also leads to a second input of the amplifier. Additionally, a switch is controlled by a microcontroller, and one side of the switch is connected to either the input or the output of the shunt resistor. A small value resistor is also used, in which one end of the small value resistor is connected to the other input or output of the shunt resistor, and the other end of the small value resistor is connected to the second side of the switch. The switch is actuated by the microcontroller to selectively break the connection between its side of the shunt resistor and the respective input of the amplifier such that the other side of the shunt resistor leads to one input of the amplifier as normal, and also leads to the other input of the amplifier through the small value resistor.

It should be understood that the present drawings are not necessarily to scale and that the embodiments disclosed herein are sometimes illustrated by fragmentary views. In certain instances, details which are not necessary for an understanding of the present invention or which render other details difficult to perceive may have been omitted. It should also be understood that the invention is not necessarily limited to the particular embodiments illustrated herein. Like numbers utilized throughout the various figures designate like or similar parts or structure.

DETAILED DESCRIPTION

The present system and circuit relates to a self-correcting current measurement system that uses a current shunt, an amplifier circuit modified with an analog switch and shorting resistor, and a microprocessor to yield a voltage proportional to current with a certain gain. In such a circuit, current can be modeled by the linear equation $I=m \cdot (v-v_0)$, where v is the output voltage of the current measurement circuit, $v_0$ is the output voltage of the same current measuring circuit when load current is zero, and m is the trans-conductance (i.e. voltage to current conversion factor) of the circuit.

Figure 1:
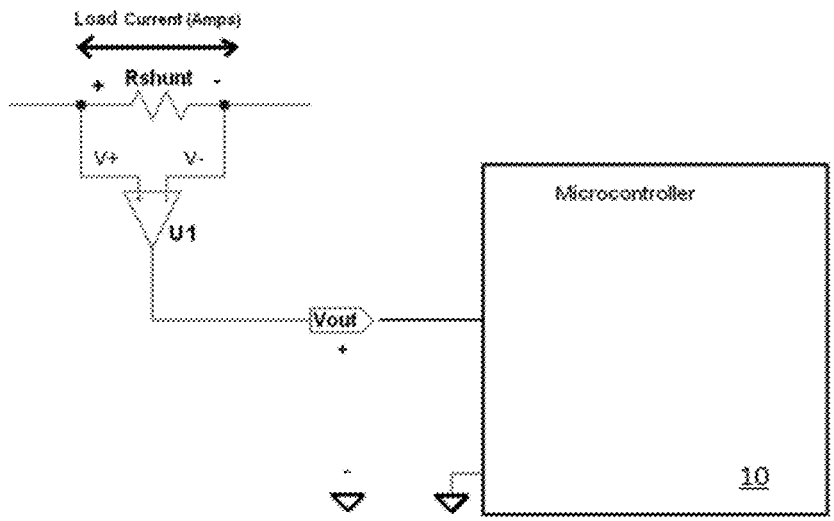
FIG. 1 is a circuit diagram illustrating a prior art shunt resistor.
Figure 2:
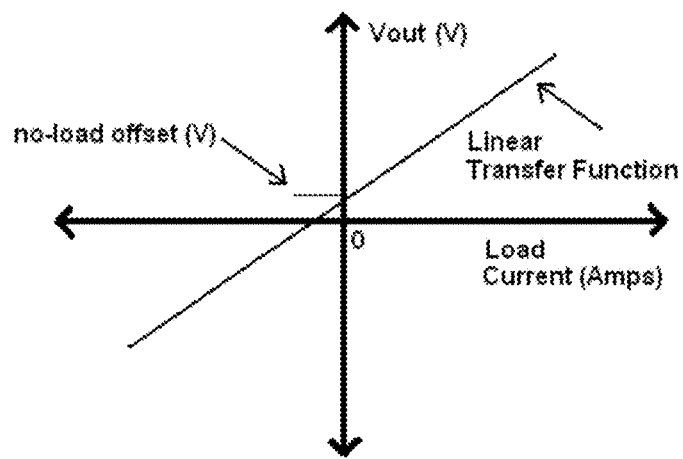
FIG. 2 is a graph showing an example transfer function with offset taken into account

Referring back to FIG. 3, the prior art circuit consists of a current shunt resistor $R_{shunt}$, optional bias and protection resistors R1 and R2, trans-impedance amplifier U1, output gain resistor $R_{out}$, optional offset bias currents Ib1 and Ib2, and optional filter capacitors C1, C2, C3 and $C_{out}$. Optional bias current Ib1's action through R1 is used when a negative offset bias is desired in the output of the circuit, and bias current Ib2 through R2 is applied when a positive offset bias is desired in the output. This corresponds to a downwards and upwards shift, respectively, of the linear transfer function in FIG. 2. Typically, only one bias current would be used at any one time.

Figure 3:
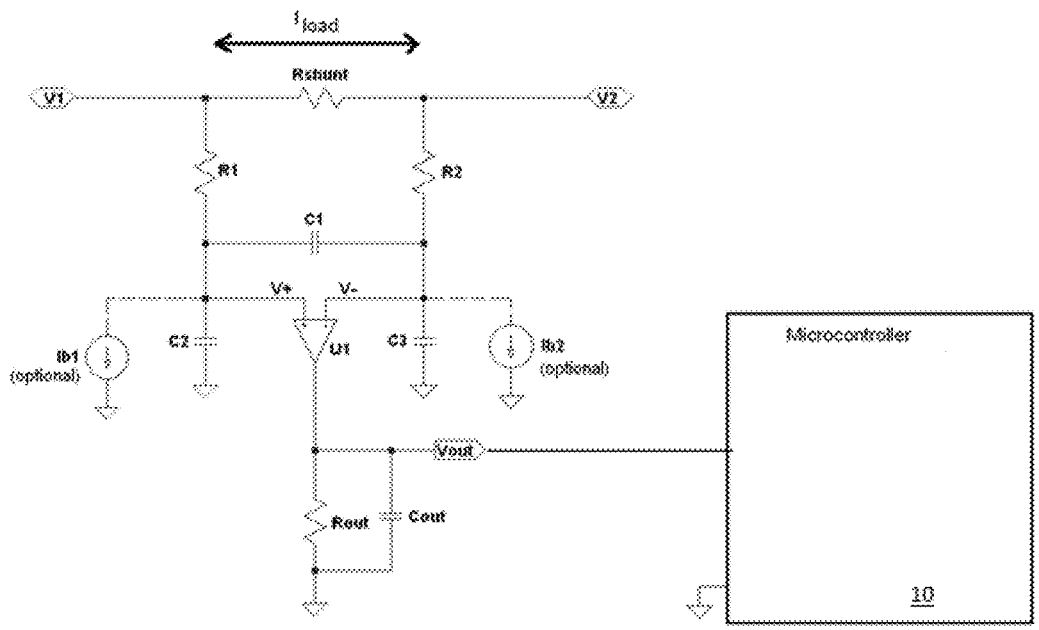
FIG. 3 is a circuit diagram illustrating a conventional prior art bi-directional high side embedded system with a shunt resistor for measuring current.

The DC transfer function can easily be derived from the circuit topology in FIG. 3. U1 represents a trans-impedance amplifier whose gain is given by term $g_m$ which refers to the linear differential voltage to current gain in units of (Amps/Volt). The DC output voltage transfer function for $V_{out}$ of the circuit can be derived by inspection ignoring the input bias currents of IC $U_1$:

$$V_{out}=g_m \cdot (v_+ - v_-) \cdot R_{out}$$

The resistor $R_{out}$ provides the circuit with additional gain by converting the current on the output U1 to a voltage which can then be processed by an analog to digital converter on the microcontroller. This equation can be re-written to be a function of the load current passing through the current shunt resistor $R_{shunt}$ given that:

$$V_{diff}=V_+ - V_- \text{ and } V_{diff}=I_{load} \cdot R_{shunt}$$

an expression can be derived for the circuit output voltage as a function of $I_{load}$:

$$V_{out}=g_m \cdot (I_{load} \cdot R_{shunt}) \cdot R_{out}$$

Solving for $I_{load}$:

$$I_{load} = \frac{V_{out}}{g_m \cdot R_{shunt} \cdot R_{out}}$$

Note: The preceding calculations ignore the small error caused by resistor $R_{cal}$, which is in parallel with $R_{shunt}$. In actuality, $V_{diff}$ is also dependent on the resistance of $R_{cal}$ due to this setup.

This equation is written assuming there is no inherent offset in the current measurement. However in a real application this offset is never zero and manifests itself as an error in the current measurement. Re-writing this equation to account and correct for the offset term yields:

$$I_{load} = \frac{(V_{out} - V_{offset})}{g_m \cdot R_{shunt} \cdot R_{out}}$$

Of course, this equation assumes that the offset can be measured and known. In a system where the offset cannot be measured, by re-writing this equation, the current error term can be quantified:

$$I_{load} = \frac{V_{out}}{g_m \cdot R_{shunt} \cdot R_{out}} + I_{error}$$

Where, $$I_{error} = \frac{-V_{offset}}{g_m \cdot R_{shunt} \cdot R_{out}}$$

In order to measure the $I_{error}$ term, a modification to the conventional hardware circuit is necessary.

Figure 5:
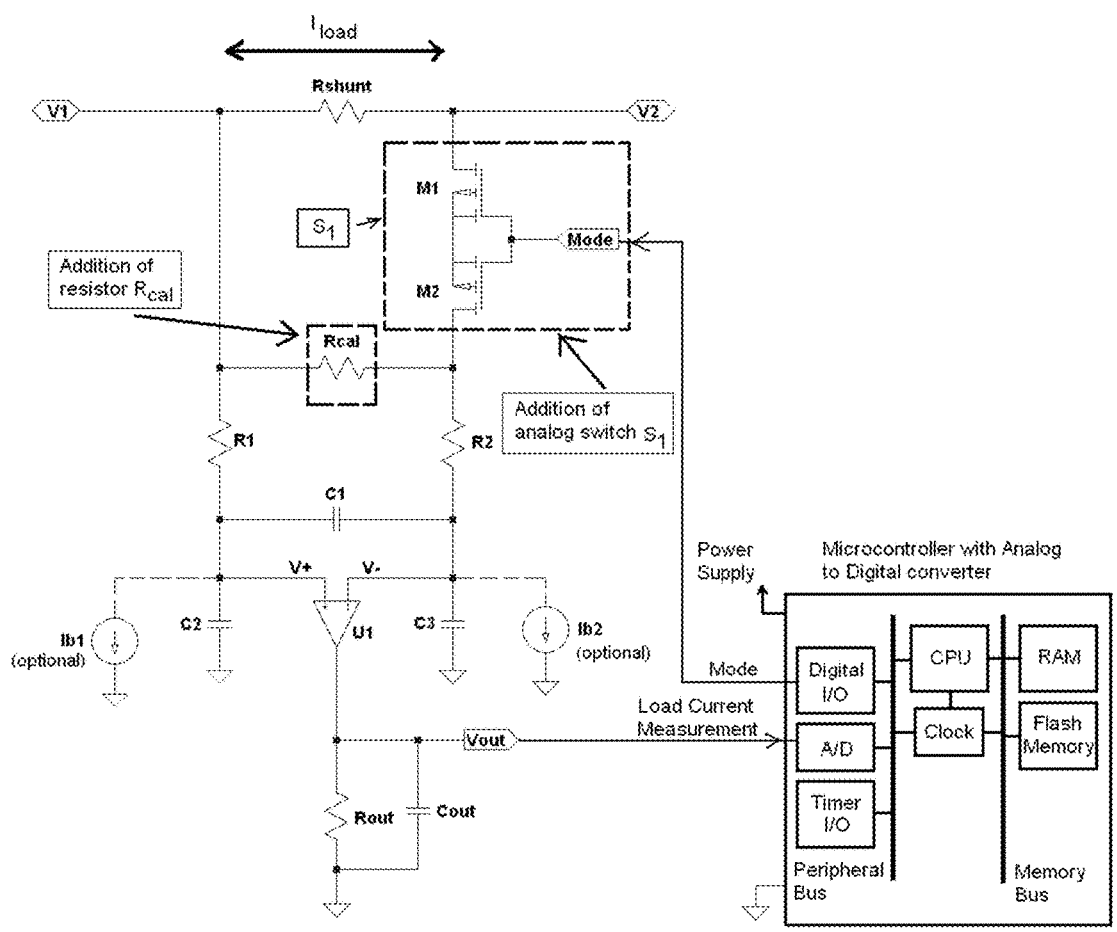
FIG. 5 is a circuit diagram of a current measurement system similar to that shown in FIG. 3, with additional offset calibration components.

Referring now to the drawings and, more particularly, to FIG. 5, a circuit diagram illustrating the addition of several components is shown.

As can be seen, the circuit diagram is very similar to that shown in FIG. 3. The circuit is a high-side, bi-directional current measurement circuit. However, two components have been added as compared to FIG. 3. First, a switch S1 has been placed between one side of $R_{shunt}$ and the corresponding input to amplifier U1. The switch is bi-directional in that it can block current in both directions, due to the circuit itself being a bi-directional circuit. Second, a resistor $R_{cal}$ has been added connecting the two inputs to amplifier U1. $R_{cal}$ is preferably about three orders of magnitude greater than $R_{shunt}$. Switch S1 is connected to the microcontroller 10, such that microcontroller 10 can open and close the switch S1 as needed. With the switch S1 closed, the circuit operates as normal. With $R_{cal}$ being larger than $R_{shunt}$, the current generally flows through $R_{shunt}$ rather than $R_{cal}$, and current through $R_{shunt}$ can be measured. However, when microcontroller 10 opens switch S1, any current which would have passed through $R_{shunt}$ has nowhere to go, so that current instead flows through $R_{cal}$. Connecting the $V_+$ and $V_-$ inputs together with a low resistance resistor simulates the no-load condition. In this state, the no-load offset can be determined by measuring the output voltage of the circuit without turning off the load.

Switch S1 has been generalized above as an "ideal" switch thus far, in that it can be treated as a disconnected wire when off. However, FIGS. 5 and 6 below illustrate a circuit which is not bi-directional. In the embodiment illustrated in FIG. 5, the switch S1 includes transistors M1 and M2. As can be seen, the diode in Switch S1 in this case faces one direction or the other, depending on the current's direction.

Figure 4:
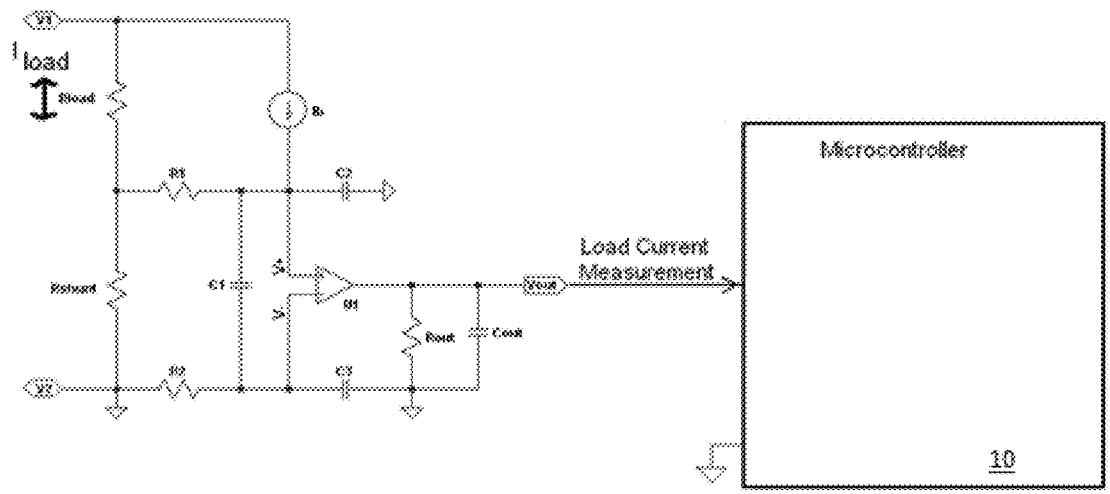
FIG. 4 is a circuit diagram illustrating a conventional prior art low-side current measurement circuit.
Figures 6, 7:
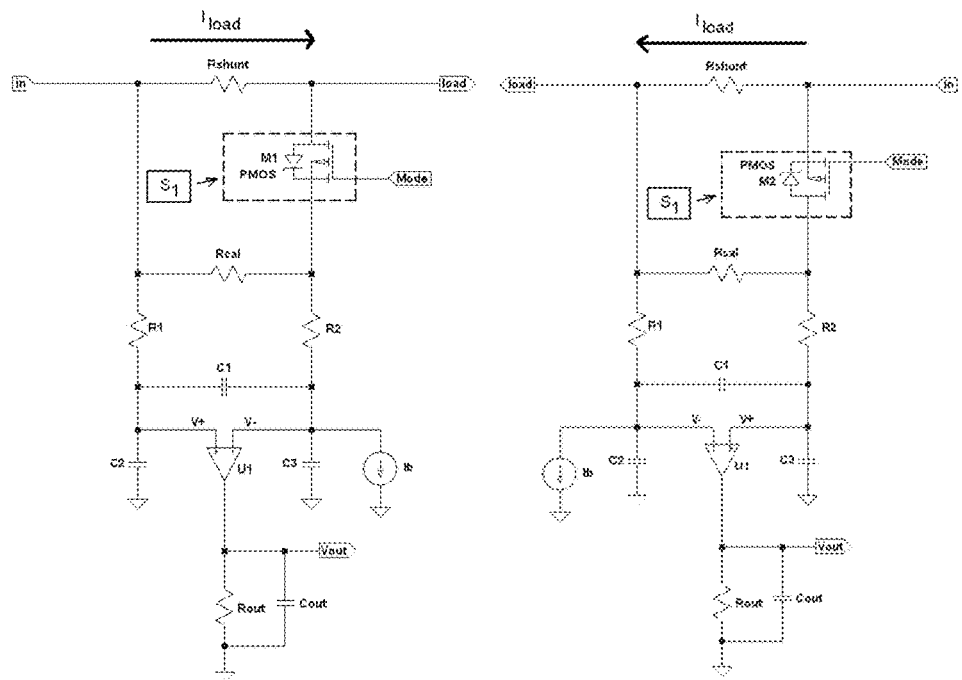
FIG. 6 is a circuit diagram similar to that shown in FIG. 5, in which the current flows in only one direction.
FIG. 7 is a circuit diagram similar to that shown in FIG. 6, in which the current flows in only the other direction.
Figure 8:
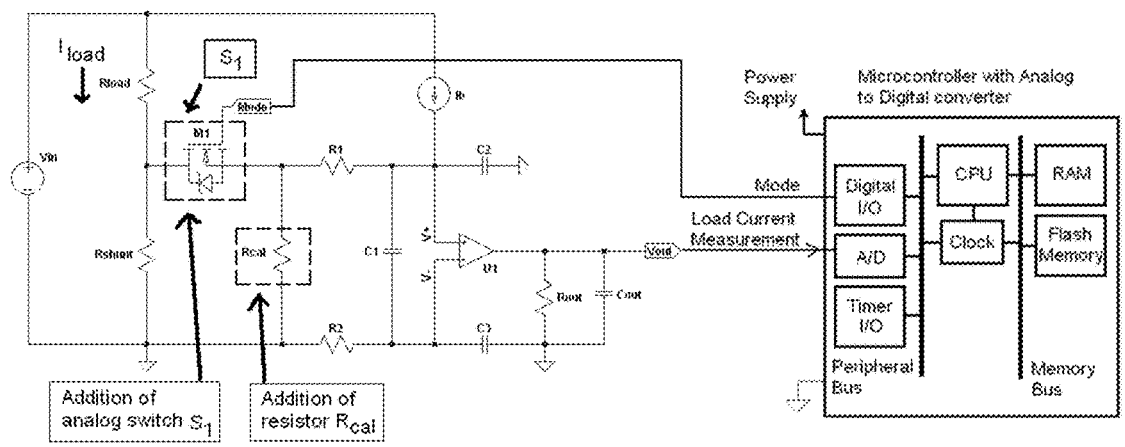
FIG. 8 is a circuit diagram of a current measurement system similar to that shown in FIG. 4, with additional offset calibration components.
Figure 9:
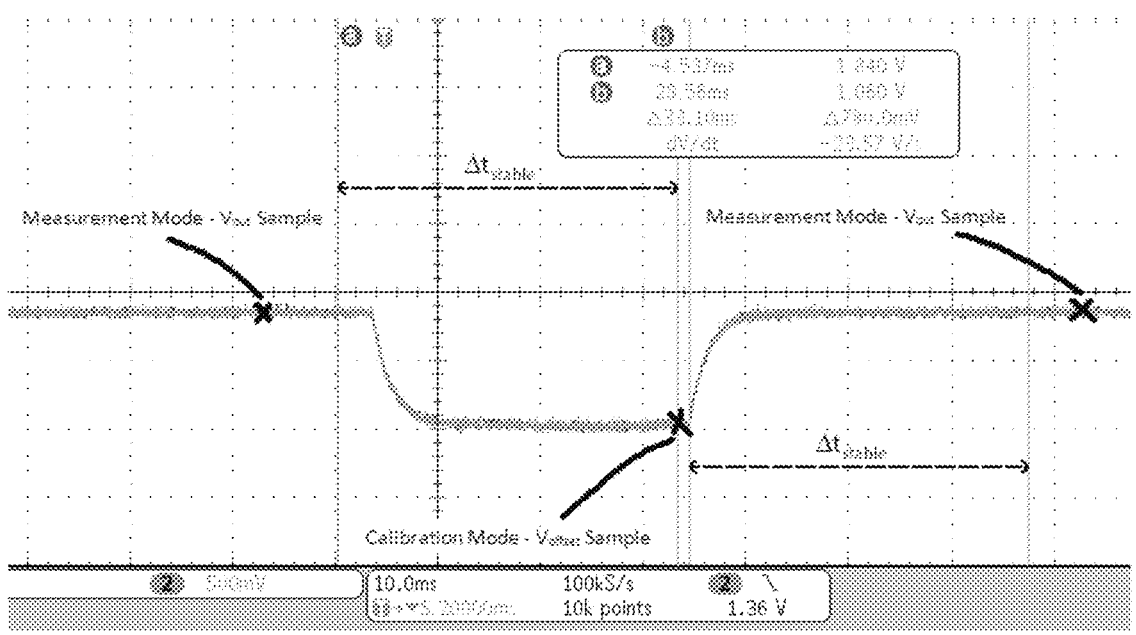
FIG. 9 is a labeled image from an oscilloscope which shows voltage output of a current measurement system. The system switches between measurement and calibration mode and waits $\Delta t_{stable}$ before taking samples.

FIG. 6 is a very similar circuit diagram to that shown in FIG. 4. The circuit is a low-side, uni-directional current measurement circuit. However, as above, a switch and a low-value resistor have been added. Making switch S1 a bi-directional switch in which current can be cutoff in both directions easily changes the circuit from a uni-directional to a bi-directional version. As above, $R_{cal}$ has been added connecting the two inputs to amplifier U1. Switch S1 is again connected to the microcontroller 10, such that microcontroller 10 can open and close the switch S1 as needed. With the switch S1 closed, the circuit operates as normal. With $R_{cal}$ being larger than $R_{shunt}$, the current generally flows through $R_{shunt}$ rather than $R_{cal}$, and current through $R_{shunt}$ can be measured. However, when microcontroller 10 opens switch S1, $R_{cal}$ connects the inputs to the amplifier U1. Connecting the $V_+$ and $V_-$ inputs together with a low resistance resistor simulates the no-load condition. In this state, the no-load offset can be determined by measuring the output voltage of the circuit without turning off the load.

In operation, the microcontroller 10 switches from measurement mode to calibration mode from time to time, in order to ensure that all measurements in current measurement mode remain accurate as the offset drifts.

Figure 10:
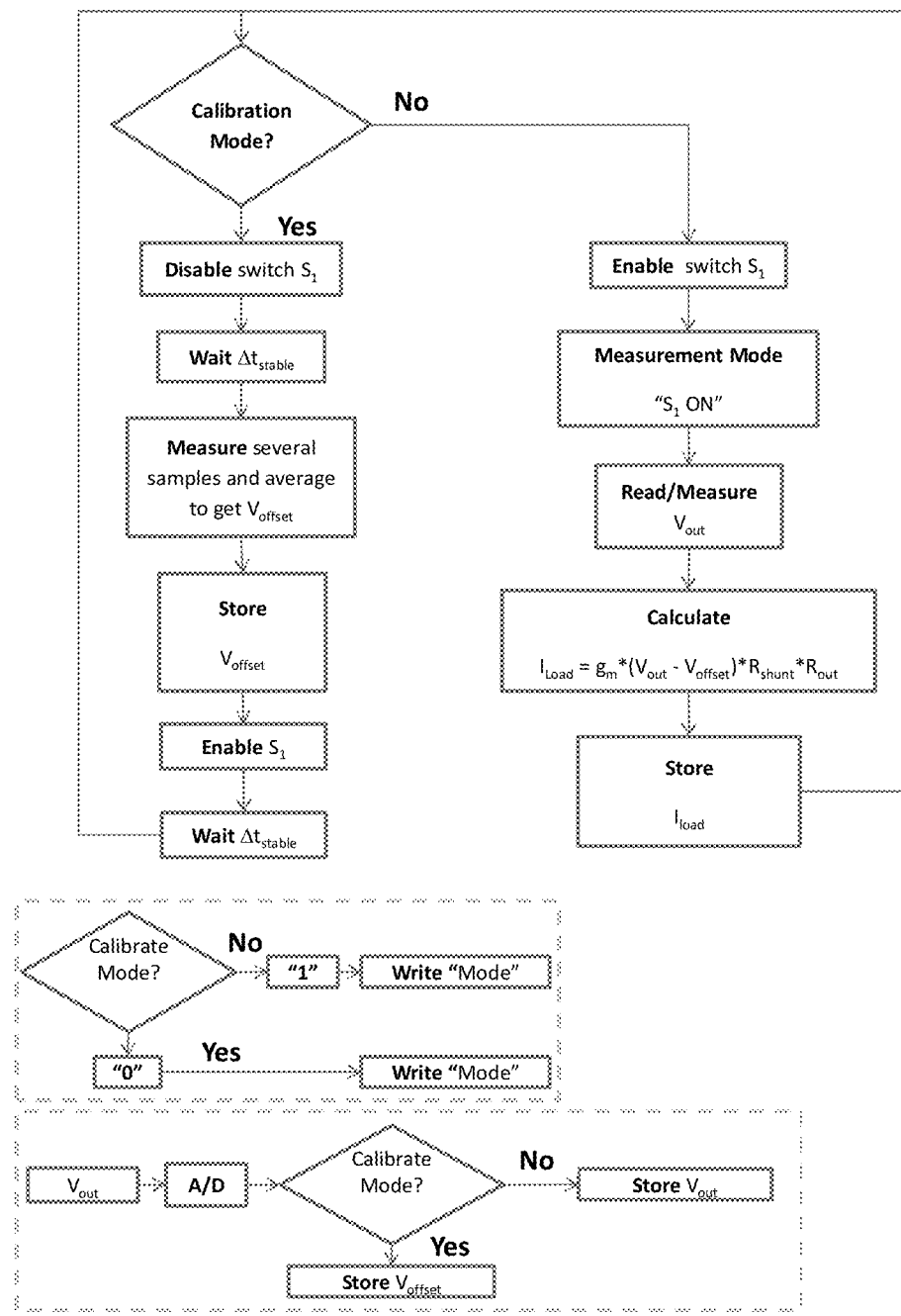
FIG. 10 is a flow diagram showing the microcontroller's logic.

FIG. 10 illustrates the flow diagram of the process undertaken by microcontroller 10 to properly calibrate the measurements in measurement mode. In measurement mode, the switch S1 is closed and $V_{out}$ is read. Then, the measured value of $V_{out}$ and the previously determined value for $V_{offset}$ are used in the equation:

$$I_{load} = g_m * (V_{out} - V_{offset}) * R_{shunt} * R_{out}$$

to determine the current passing through the load. However, once calibration mode is initiated, the microcontroller 10 causes switch S1 to open. It is assumed that voltage output during current measurement mode will be relatively high. Therefore, when the circuit enters calibration mode, the system pauses for time $\Delta t_{stable}$ to allow the lowpass filter composed of $R_{out}$ and $C_{out}$ enough time to discharge. This ensures that the output voltage will reach the true value of $V_{offset}$ in order to avoid inaccuracies in current measurement. After a period of time passes $\Delta t_{stable}$, several $V_{out}$ samples are measured and averaged to get a new value for $V_{offset}$, which is then stored. Switch S1 is then closed, and the system pauses again for $\Delta t_{stable}$ to allow the circuit to recharge capacitor $C_{out}$ before beginning further current measurements. Note that it is preferable to take multiple samples of $V_{offset}$ during calibration mode and average their sum for minimal error.

Microcontroller 10 outputs a signal to switch S1 to control the opening and closing thereof. The signal may be as simple as a 0 for calibration mode (and therefore opening of the switch S1) and a 1 for measurement mode (and therefore closing of the switch S1). Similarly, the "$V_{out}$" input to the microcontroller 10 is saved to different locations depending on the mode. In calibration mode, the input is stored as $V_{offset}$, while in normal measurement mode, the input is stored as $V_{out}$.

What is claimed is:

1. A system for determining the no-load offset of a circuit, the system consisting of:
   a shunt resistor with an input and an output, wherein the input of the shunt resistor also leads to one input of an amplifier and the output of the shunt resistor also leads to a second input of the amplifier;
   a switch controlled by a microcontroller, a first side of said switch being connected to one of the input and output of the shunt resistor;
   a small value resistor, a first end of the small value resistor being connected to the other of the input and output of the shunt resistor, and a second end of the small value resistor being connected to a second side of the switch;
   wherein the switch is actuated by the microcontroller to selectively break the connection between its side of the shunt resistor and the respective input of the amplifier such that the other side of the shunt resistor leads to one input of the amplifier as normal, and also leads to the other input of the amplifier through the small value resistor.

2. The system of claim 1, wherein the switch is a uni-directional switch.

3. The system of claim 1, wherein the switch is a bi-directional switch.

4. The system of claim 1, wherein the system may be applied to high-side or low-side circuits.

5. The system of claim 1, wherein the switch is an analog switch.

6. The system of claim 1, wherein the small value resistor is about three orders of magnitude greater than the shunt resistor.

7. A system for determining the no-load offset of a circuit, the system consisting of:
   a shunt resistor including an input and an output, wherein the input and output of the shunt resistor are in electronic communication with a first and second input of an amplifier, respectively;
   a switch controlled by a microprocessor to configure the circuit between a current measurement mode and a calibration mode, a first side of said switch being connected to one of the input and output of the shunt resistor;
   a small value resistor having a first end and a second end, the first end being connected to the other of the input and output of the shunt resistor, and a second end of the small value resistor being connected to a second side of the switch; and
   wherein the switch is actuated by the microcontroller to selectively break the connection between its side of the shunt resistor and the respective input of the amplifier such that the other side of the shunt resistor leads to one input of the amplifier as normal, and also leads to the other input of the amplifier through the small value resistor.

8. The system of claim 7, wherein the switch is a uni-directional switch.

9. The system of claim 7, wherein the switch is a bi-directional switch.

10. The system of claim 7, wherein the system may be applied to high-side or low-side circuits.

11. The system of claim 7, wherein the switch is an analog switch.

12. The system of claim 7, wherein the small value resistor is about three orders of magnitude greater than the shunt resistor.

* * * * *